(12) United States Patent
Takamaru et al.

(10) Patent No.: US 9,989,828 B2
(45) Date of Patent: Jun. 5, 2018

(54) SEMICONDUCTOR DEVICE AND LIQUID CRYSTAL DISPLAY DEVICE

(71) Applicant: Sharp Kabushiki Kaisha, Osaka (JP)

(72) Inventors: Yutaka Takamaru, Osaka (JP);
Hiroshi Matsukizono, Osaka (JP);
Tadayoshi Miyamoto, Osaka (JP);
Takao Saitoh, Osaka (JP); Yohsuke Kanzaki, Osaka (JP); Keisuke Ide, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days. days.

(21) Appl. No.: 15/504,963

(22) PCT Filed: Aug. 17, 2015

(86) PCT No.: PCT/JP2015/073003
§ 371 (c)(1),
(2) Date: Feb. 17, 2017

(87) PCT Pub. No.: WO2016/027758
PCT Pub. Date: Feb. 25, 2016

(65) Prior Publication Data
US 2017/0261790 A1 Sep. 14, 2017

(30) Foreign Application Priority Data
Aug. 20, 2014 (JP) .................................. 2014-167414

(51) Int. Cl.
*G02F 1/136* (2006.01)
*G02F 1/1368* (2006.01)
*G02F 1/1343* (2006.01)

(52) U.S. Cl.
CPC ...... *G02F 1/1368* (2013.01); *G02F 1/134363* (2013.01); *G02F 2001/134372* (2013.01);
(Continued)

(58) Field of Classification Search
CPC ............. G02F 1/1368; G02F 1/134363; G02F 2202/10
(Continued)

(56) References Cited

U.S. PATENT DOCUMENTS

2015/0069381 A1    3/2015  Miyamoto et al.
2015/0129865 A1*   5/2015  Miyamoto ............ G02F 1/1368
                                                   257/43

FOREIGN PATENT DOCUMENTS

WO    2013/137045 A1   9/2013
WO    2013/151002 A1   10/2013

* cited by examiner

*Primary Examiner* — Thanh-Nhan P Nguyen
(74) *Attorney, Agent, or Firm* — Chen Yoshimura LLP

(57) ABSTRACT

A semiconductor device includes: a first substrate; a gate electrode on the first substrate; a gate insulating layer on the gate electrode; an oxide semiconductor film including a channel region disposed over the gate electrode through the gate insulating layer and lowered-resistance region contacting the channel region; a source electrode and a drain electrode on the channel region; a first insulating film covering at least the channel region and including a contact hole that exposes the lowered-resistance region; and a second insulating film having reducing characteristics and disposed above the first insulating film across the contact hole, the second insulating film contacting the lowered-resistance region inside the contact hole.

7 Claims, 19 Drawing Sheets

(52) U.S. Cl.
CPC .. *G02F 2201/121* (2013.01); *G02F 2201/123* (2013.01); *G02F 2201/40* (2013.01); *G02F 2202/10* (2013.01)

(58) Field of Classification Search
USPC .................................................. 349/43, 141
See application file for complete search history.

SEMICONDUCTOR DEVICE AND LIQUID CRYSTAL DISPLAY DEVICE

TECHNICAL FIELD

The technology described in the present specification relates to a semiconductor device and liquid crystal display device.

BACKGROUND ART

In the field of liquid crystal display devices, lateral electric field schemes such as IPS (in-plane switching) and FFS (fringe field switching) have been receiving attention in recent years. Among the liquid crystal display devices using a lateral electric field scheme, in IPS the pair of electrodes arranged on the TFT (thin film transistor) substrate do not overlap in a plan view, whereas in FFS the pair of electrodes do overlap in a plan view. In these liquid crystal display devices using a lateral electric field scheme, liquid crystal is held between a pair of substrates that are arranged facing each other, and a pair of electrodes are disposed on one of the substrates, the TFT substrate, separated by an insulating film, with the electric field for driving the liquid crystal film being generated between this pair of electrodes.

In an FFS liquid crystal display device, the pair of electrodes are arranged on the TFT substrate above/below one another with an insulating film therebetween, with one of the electrodes being a pixel electrode and the other being a common electrode. The liquid crystal display device can be operated regardless of whether the electrode disposed lower among the pair of electrodes is the pixel electrode or common electrode. In this type of liquid crystal display device, there are proposals to use an oxide semiconductor film as the material for forming the channel region of the TFTs. An oxide semiconductor film has a higher electron mobility than amorphous silicon or the like, which would make it possible to operate the TFTs at high speeds.

A configuration is known whereby, in an FFS liquid crystal display device where the channel regions of the TFTs are formed by an oxide semiconductor film in this manner, a portion of the oxide semiconductor film has the resistance thereof lowered by a hydrogen plasma treatment or the like, and this lowered-resistance region is used as the conductive region constituting the pixel electrode or common electrode. Patent Document 1 below, for example, discloses an FFS liquid crystal display panel in which, among the pair of electrodes, the pixel electrode is disposed lower and the common electrode is disposed higher. In this liquid crystal display panel, a reducing insulating film is formed on the oxide semiconductor film, thereby reducing and lowering the resistance of the region of the oxide semiconductor film contacting the insulating film, and this lowered-resistance region functions as the pixel electrode. This cuts manufacturing costs by forming the lowered-resistance region out of a portion of the oxide semiconductor film, rather than performing a special treatment such as a hydrogen plasma treatment on the oxide semiconductor film.

RELATED ART DOCUMENT

Patent Document

Patent Document 1: WO 2013/151002

Problems to be Solved by the Invention

However, in the liquid crystal panel described in Patent Document 1 above, a portion of the oxide semiconductor film has the resistance thereof lowered in the manufacturing process by forming an insulating film directly on the oxide semiconductor film. Thus, when forming the insulating film, there is a risk that the channel region of the oxide semiconductor film will be affected by the insulating film and thus be reduced. If the channel region of the oxide semiconductor film is reduced in this manner, the operational reliability of the TFT will be degraded.

SUMMARY OF THE INVENTION

The technology described in the present specification was made in view of the above problem and aims at providing a semiconductor device that can cut manufacturing costs while ensuring an excellent operational reliability.

Means for Solving the Problems

In one aspect, the present disclosure provides a semiconductor device, including: a first conductive film; an oxide semiconductor film including a channel region and a lowered-resistance region that has a lower electrical resistance than the channel region, the oxide semiconductor film electrically connecting the first conductive film and lowered-resistance region via the channel region; a first insulating film covering at least the channel region and including a contact hole that exposes the lowered-resistance region; and a second insulating film having reducing characteristics and disposed above the first insulating film across the contact hole, the second insulating film contacting the lowered-resistance region inside the contact hole.

In the manufacturing process of the semiconductor device described above, the second protective film having reducing characteristics contacts a portion of the oxide semiconductor film exposed inside the contact hole, and this reduces the region of the oxide semiconductor film contacting the second protective film, thereby lowering the resistance of this region and forming the lowered-resistance region. Therefore, it is possible to form the lowered-resistance region in a portion of the oxide semiconductor film without performing a special treatment such as a hydrogen plasma treatment on the oxide semiconductor film, thereby allowing for manufacturing costs to be cut.

Moreover, in the semiconductor device described above, the first insulating film is disposed below the second insulating film so as to cover the channel region; thus, in the manufacturing process of the semiconductor device, the channel region is covered by the first insulating film before the second insulating film is formed. Therefore, when forming the second insulating film in the manufacturing process, the channel region is not susceptible to being affected by the second insulating film, which makes it possible to prevent or inhibit the channel region from being reduced due to being affected by the second insulating film. As a result, it is possible for the semiconductor device to have excellent operational reliability. In this manner, the semiconductor device described above makes it possible to cut manufacturing costs while ensuring excellent operational reliability.

The semiconductor device may further include a second conductive film electrically connected to the lowered-resistance region and having a lower electrical resistance than the lowered-resistance region, and the first conductive film and second conductive film may electrically connect via the channel region.

With this configuration, by interposing a second conductive film with a lower electrical resistance than the lowered-resistance region between the lowered-resistance region and channel region, it is easy for electrons to move between the first conductive film and lowered-resistance region, which makes it possible for the semiconductor device to have excellent electron mobility.

In the semiconductor device, a connection location of the channel region to the first conductive film may be above the first conductive film, and a connection location of the channel region to the second conductive film may be above the second conductive film, and a connection location of the lowered-resistance region to the second conductive film may be above the second conductive film.

In the manufacturing process of the semiconductor device, when the first conductive film and second conductive film are formed after the oxide semiconductor film, damage may occur to the oxide semiconductor film during forming of first conductive film and second conductive film, and defects may occur in the oxide semiconductor film. Meanwhile, if the oxide semiconductor film is formed after the first conductive film and second conductive film are formed, the location of the channel connecting with the first conductive film is disposed above the first conductive film, and the location of the channel region connecting with the second conductive film and the location of the lowered-resistance region connecting with the second conductive film are each disposed above the second conductive film. In other words, the configuration above is made by forming the oxide semiconductor film after the first conductive film and second conductive film in the manufacturing process. Thus, the configuration above makes it possible to prevent or inhibit defects from occurring in the oxide semiconductor film.

In the semiconductor device, the channel region may be directly connected to the lowered-resistance region.

With this configuration, it is not necessary to form a metal film for the drain electrode or the like between the channel region and lowered-resistance region in the manufacturing process, and thus it is unnecessary to consider the yield for such a metal film, which makes it possible to cut manufacturing costs even more.

In the semiconductor device, the second insulating film may surround, in a plan view, the first insulating film that covers the channel With this configuration, the second insulating film covers the side end of the first insulating film that covers the channel region. Therefore, it is possible to prevent or inhibit light from entering into the first insulating film from the side end of the first insulating film. As a result, it is possible to prevent or inhibit the susceptibility of degradation of the channel region that would be caused by light that has entered the first insulating film reverberating between the first insulating film and second insulating film and then entering the channel region.

In the semiconductor device, the second insulating film may contain hydrogen.

Hydrogen has strong reducing characteristics. Therefore, with the configuration above, introducing the hydrogen inside the second insulating film into the region of the oxide semiconductor film contacting the second insulating film makes it easy to reduce this region and lower the resistance of the region. In this manner, the configuration described above makes it possible to provide a specific configuration for lowering the resistance of the region of the oxide semiconductor film contacting the second insulating film.

In the semiconductor device, a distance between an edge of the contact hole and the first conductive film may be greater than 1.5 μm.

The diffusion distance of the hydrogen inside the oxide semiconductor film is 1.5 μm under prescribed parameters. With this configuration, under prescribed parameters, it is possible to prevent or inhibit the hydrogen that has been introduced into a portion of the oxide semiconductor film exposed in the contact hole from diffusing into the first conductive film from the second insulating film in the manufacturing process. This allows further enhancement of the operational reliability of the semiconductor device.

The oxide semiconductor film may contain indium (In), gallium (Ga), zinc (Zn), and oxygen (O). In such a case, the oxide semiconductor film may be a crystalline oxide semiconductor film.

This configuration is suitable for making the semiconductor device multifunctional.

In another aspect, the present disclosure provides a liquid crystal display device, including: a first substrate on which the semiconductor device is formed; a second substrate facing the first substrate; and a liquid crystal layer containing liquid crystal molecules and interposed between the first substrate and second substrate, wherein the semiconductor device includes a third conductive film disposed in a location above the second insulating film overlapping at least the lowered-resistance region in a plan view, wherein one of the lowered-resistance region and the third conductive film has a plurality of slit openings having slit-like shapes, the one of the lowered-resistance region and the third conductive film forming a pixel electrode in each pixel, and wherein another of the lowered-resistance region and the third conductive film forms a common electrode that generates an electric field between the common electrode and the pixel electrode to control orientation of the liquid crystal molecules.

The liquid crystal display device described above has pixel electrodes and a common electrode on a first substrate separated by a second insulating film, and the pixel electrodes have slit openings and overlap the common electrode in a plan view, thereby realizing an FFS liquid crystal display device. Furthermore, the lowered-resistance region, which is one portion of the oxide semiconductor film, serves as either a pixel electrode or common electrode, and thus it is not necessary to separately form the pixel electrode or common electrode in the manufacturing process. Therefore, it is possible to realize an FFS liquid crystal display device while cutting manufacturing costs.

Effects of the Invention

The technology described in the present specification and aims at providing a semiconductor device that can cut manufacturing costs while ensuring an excellent operational reliability.

DETAILED DESCRIPTION OF EMBODIMENTS

Embodiment 1

Figure 1:
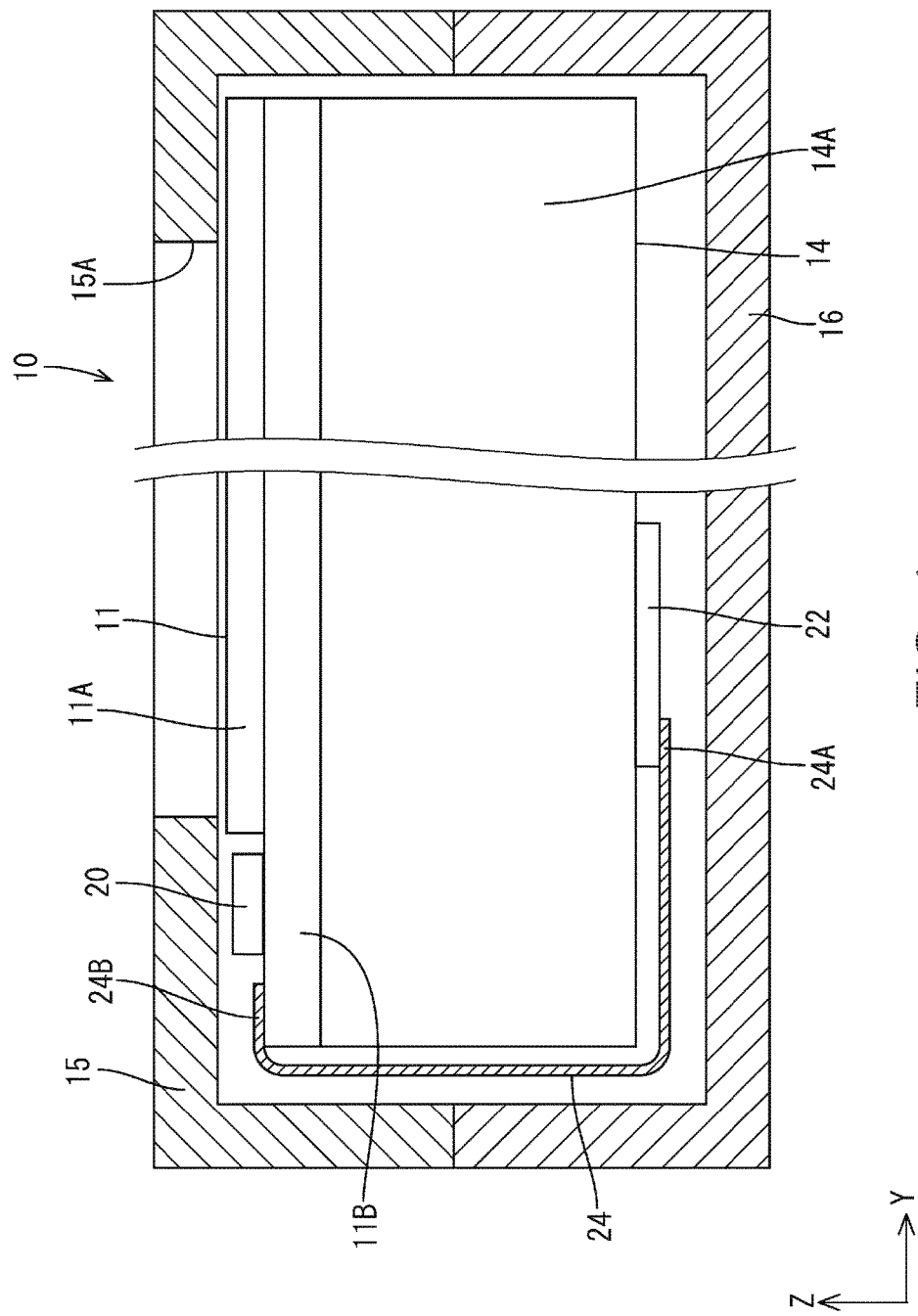
FIG. 1 is a schematic cross-sectional view taken along the lengthwise direction of a liquid crystal display device of Embodiment 1.

Embodiment 1 will be explained with reference to FIGS. 1 to 13. In the present embodiment, a liquid crystal display device 10 including a liquid crystal panel 11 will be described as an example. Each of the drawings indicates an X-axis, a Y-axis, and a-Z axis in a portion of FIGS. 1 to 4, and each of the axes indicates the same direction for the respective drawings. The up and down direction in the drawings is based on the up and down direction in FIG. 1, and the upper side in FIG. 1 is referred to as the front side while the lower side thereof is referred to as the rear side.

Figure 2:
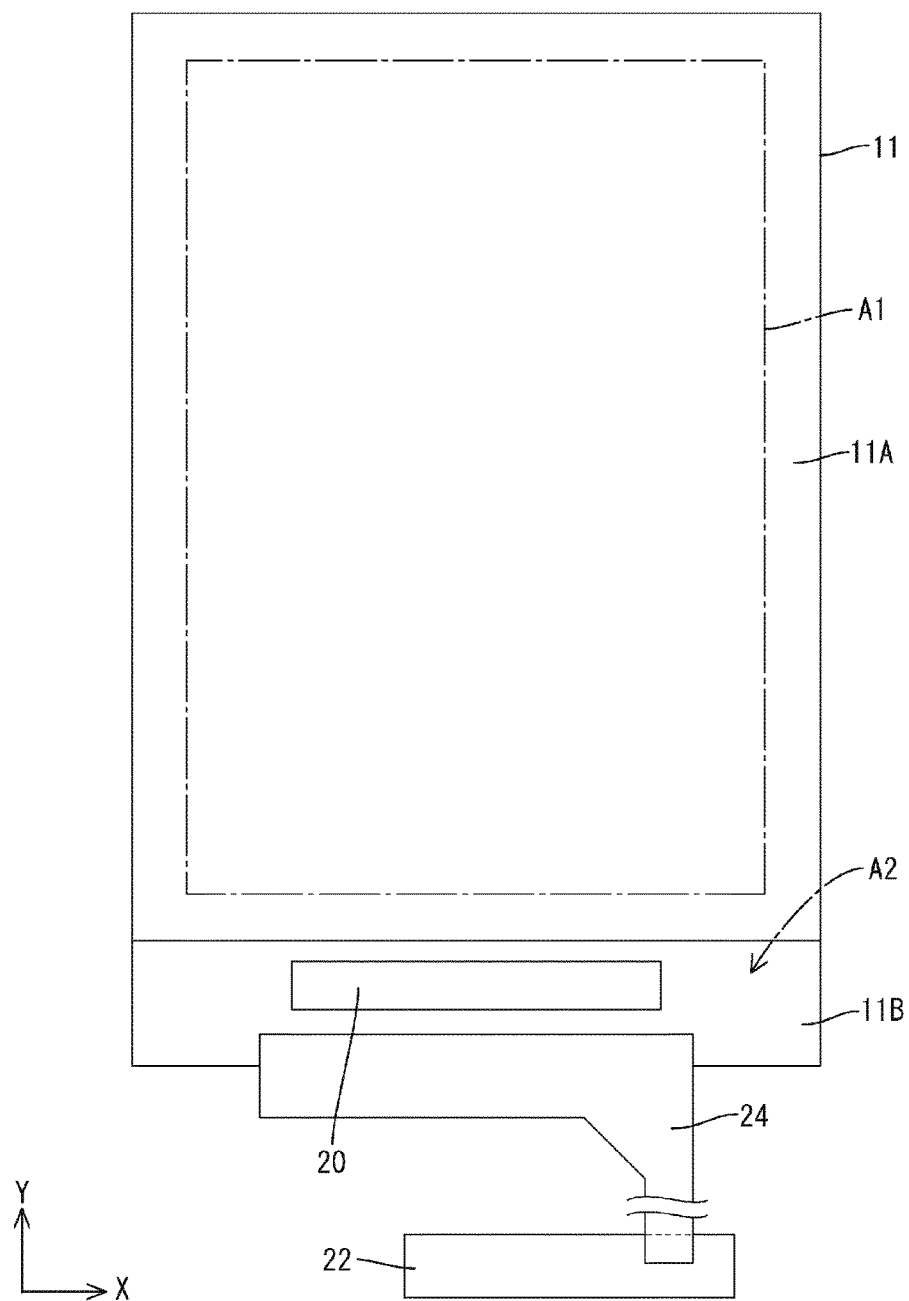
FIG. 2 is a schematic plan view of the liquid crystal panel.

As shown in FIGS. 1 and 2, the liquid crystal display device 10 includes the liquid crystal panel 11, an IC chip 20, which is an electronic component that is mounted on and drives the liquid crystal panel 11, a controller substrate 22 that externally supplies various types of input signals to the IC chip 20, a flexible substrate 24 that electrically connects the liquid crystal panel 11 and the external controller substrate 22, and a backlight device 14, which is an external light source that supplies light to the liquid crystal panel 11. Furthermore, the liquid crystal display device 10 includes front and rear external members 15 and 16 for housing and holding the liquid crystal panel 11 and the backlight device 14, which are attached together, and the front external member 15 has an opening 15A that allows an image displayed on the liquid crystal panel 11 to be viewed from outside.

First, the backlight device 14 will be briefly explained. As shown in FIG. 1, the backlight device 14 includes a generally box-shaped chassis 14A that opens towards the front, a light source (cold cathode fluorescent tube, LED, organic EL, etc.; not shown) disposed inside the chassis 14A, and an optical member (not shown) disposed so as to cover the opening in the chassis 14A. The optical member has functions such as converting light emitted from the light source into planar light. The light that has passed through the optical member to become planar light enters the liquid crystal panel 11 and is used to display an image on the liquid crystal panel 11.

Next, the liquid crystal panel 11 will be described. As shown in FIG. 2, the liquid crystal panel 11 has a vertically-long rectangular shape as a whole, the lengthwise direction of which matches the Y-axis direction in each drawing and the widthwise direction matching the X-axis direction in each drawing. A large portion of the liquid crystal panel 11 is a display area A1 where images can be displayed, and the location on the panel towards one edge thereof in the lengthwise direction (the bottom in FIG. 2) is a non-display area A2 where images are not displayed. The IC chip 20 and flexible substrate 24 are mounted on a portion of the non-display area A2. As shown in FIG. 1, in the liquid crystal panel 11, the frame-shaped dot-dash line that is slightly smaller than the color filter substrate 11A (described later) forms the external shape of the display area A1, and the area outside this dot-dash line is the non-display area A2.

Figure 3:
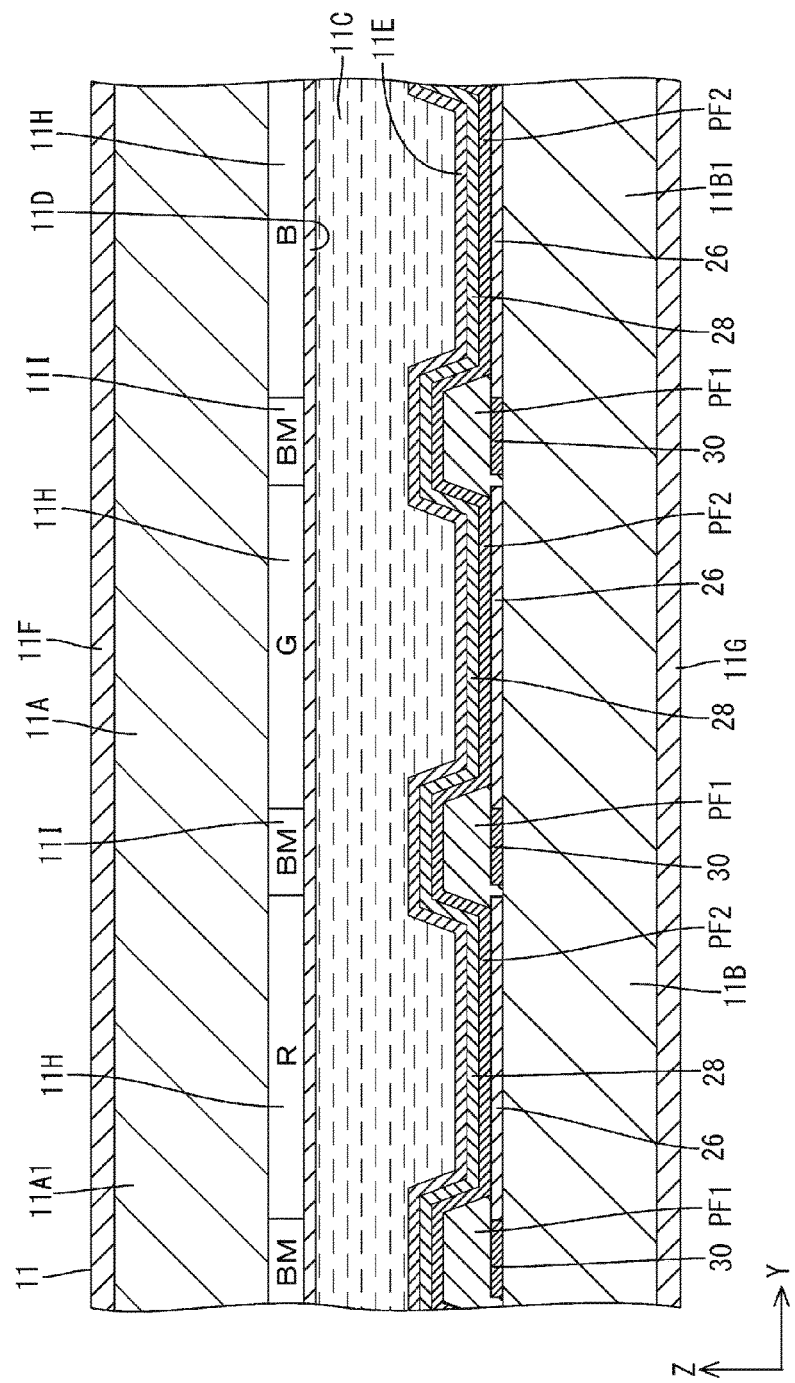
FIG. 3 is a schematic cross-sectional view showing a cross-sectional configuration of the liquid crystal panel.

As shown in FIG. 3, the liquid crystal panel 11 includes a pair of glass substrates 11A and 11B with excellent transmissive characteristics, and a liquid crystal layer 11C having liquid crystal molecules, which are a material whose optical characteristics change in accordance with the electrical field applied thereto. Both substrates 11A and 11B constituting the liquid crystal panel 11 are bonded together by a sealant (not shown) in a state in which a cell gap equivalent to the thickness of the liquid crystal layer 11C is maintained between the substrates. Among both substrates 11A and 11B, the front (upper) substrate 11A is the color filter substrate (one example of a second substrate) 11A, and the rear (back) substrate 11B is the array substrate (one example of a first substrate) 11B. Alignment films 11D and 11E for aligning the liquid crystal molecules included in the liquid crystal layer 11C are respectively formed on the inner surface sides of the two substrate 11A and 11B. Both substrates 11A and 11B are constituted by generally transparent glass substrates 11A1 and 11B1, and polarizing plates 11F and 11G are respectively attached to the outer surfaces of these glass substrates 11A1 and 11B1.

As shown in FIG. 2, among both substrates 11A and 11B, the color filter substrate 11A has approximately the same widthwise dimensions as the array substrate 11B, whereas the lengthwise dimensions are smaller than the array substrate 11B, and the substrates are bonded together with one end of the array substrate 11B in the lengthwise direction (the top in FIG. 2) coinciding in position with the color filter substrate. Accordingly, the other end of the array substrate 11B in the lengthwise direction (the bottom in FIG. 1) does not overlap the color filter substrate 11A over a prescribed range, with both front and rear surfaces being exposed to outside, and this exposed area is secured as the mounting area of the IC chip 20 and flexible substrate 24. The glass substrate 11B1 constituting the array substrate 11B has the color filter substrate 11A and polarizing plate 11G bonded to the primary section thereof, and the section secured for the mounting area of the IC chip 20 and flexible substrate 24 does not overlap the color filter substrate 11A and polarizing plate 11G.

Figure 4:
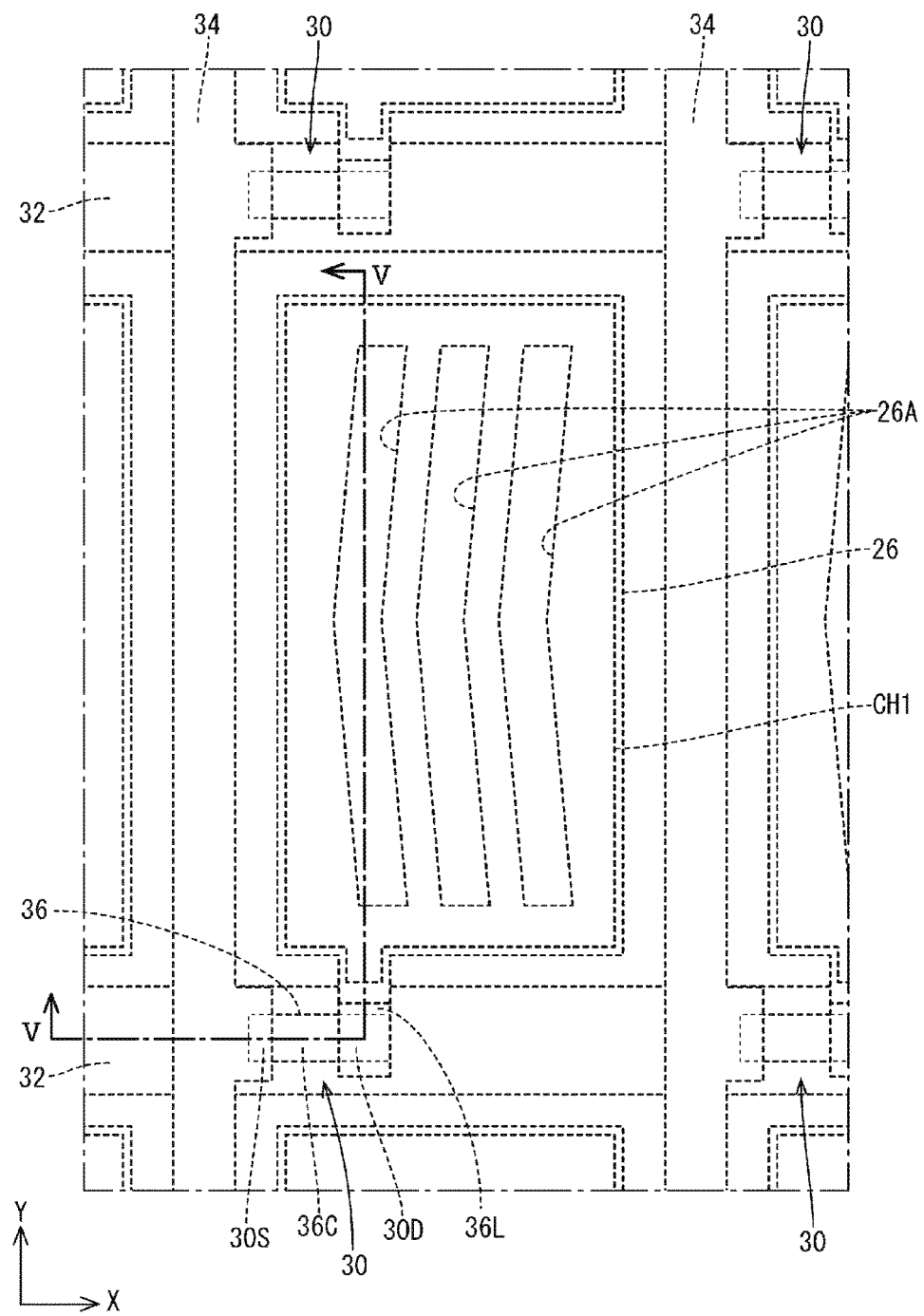
FIG. 4 is a plan view of a planar configuration of a pixel in a display area of an array substrate.

As shown in FIG. 3, the liquid crystal panel 11 of the present embodiment has an FFS operating scheme, and both the pixel 26 and the common 28 are formed on the array substrate 11B side of the pair of substrates 11A and 11B, and these pixel electrodes 26 and common electrodes 28 are disposed in different layers with an insulating film therebetween (a first protective film PF1 and second protective film PF2; described later). The pixel electrodes 26 and common electrodes 28 are both transparent electrode films made of a transparent electrode material. The materials etc. constituting the pixel electrodes 26 and common electrodes 28 will be described in detail later. In the present embodiment, among the pair of electrodes 26 and 28, the pixel electrodes 26 are arranged lower and the common electrodes 28 are arranged higher. As shown in FIGS. 3 and 4, a large number of TFTs (one example of a semiconductor device) 30, which are switching devices, and pixel electrodes 26 connected to the drain electrodes (one example of a second conductive film) 30D of the TFTs 30 are provided in a matrix pattern on the inner surface side (liquid crystal layer 11C side) of the glass substrate 11B1 constituting the array substrate 11B. Meanwhile, in the non-display area A2 of the liquid crystal panel 11, common electrode wiring lines (not shown) are disposed on the array substrate 11B, and these common electrode wiring lines are connected to the common electrodes 28 via a contact hole (not shown).

Next, the configuration of the array substrate 11B in the display area A1 of the liquid crystal panel 11 will be described. As shown in FIG. 4, gate wiring lines 32 and source wiring lines 34, which form a grid shape, are arranged so as to surround the periphery of the TFTs 30 and pixel electrodes 26 arranged in a matrix in the display area A1 of the array substrate 11B. The gate wiring lines 32 extend in the X-axis direction, whereas the source wiring lines 34 extend in the Y-axis direction, and the wiring lines 32 and 34 intersect with one another. The gate wiring lines 32 and source wiring lines 34 are made of a metal film constituted by a plurality of metals stacked together, and a first gate insulating film GI1 and second gate insulating film GI2 (described later) are interposed between the wiring lines 32 and 34 at the locations where the wiring lines 32 and 34 intersect one another. Furthermore, capacitance wiring lines (not shown) that are parallel to the gate wiring lines 32 are disposed on the array substrate 11B. The metal material etc. constituting the gate wiring lines 32 and source wiring lines 34 will be described in detail later.

As shown in FIG. 4, the pixel electrode 26 is formed by lowering the resistance of the oxide semiconductor film 36, which constitutes a portion of the TFT 30 as described later, and is provided in generally the entire region surrounded by the gate wiring lines 32 and source wiring lines 34 and has a vertically-long rectangular shape in a plan view. Meanwhile, the common electrode 28 has a uniformly-planar pattern that straddles a plurality of the pixel electrodes 26 in a layer above the pixel electrodes 26. The portion of the pixel electrode 26 surrounded by the gate wiring lines 32 and source wiring lines 34 has three vertically-long slit openings that are slightly bent (hereinafter, "slit openings 26A"). The three slit openings 26A are formed in each pixel along the source wiring lines 34 with a prescribed gap between the openings and the source wiring lines. The function of these slit openings 26A will be described in detail later.

Figure 5:
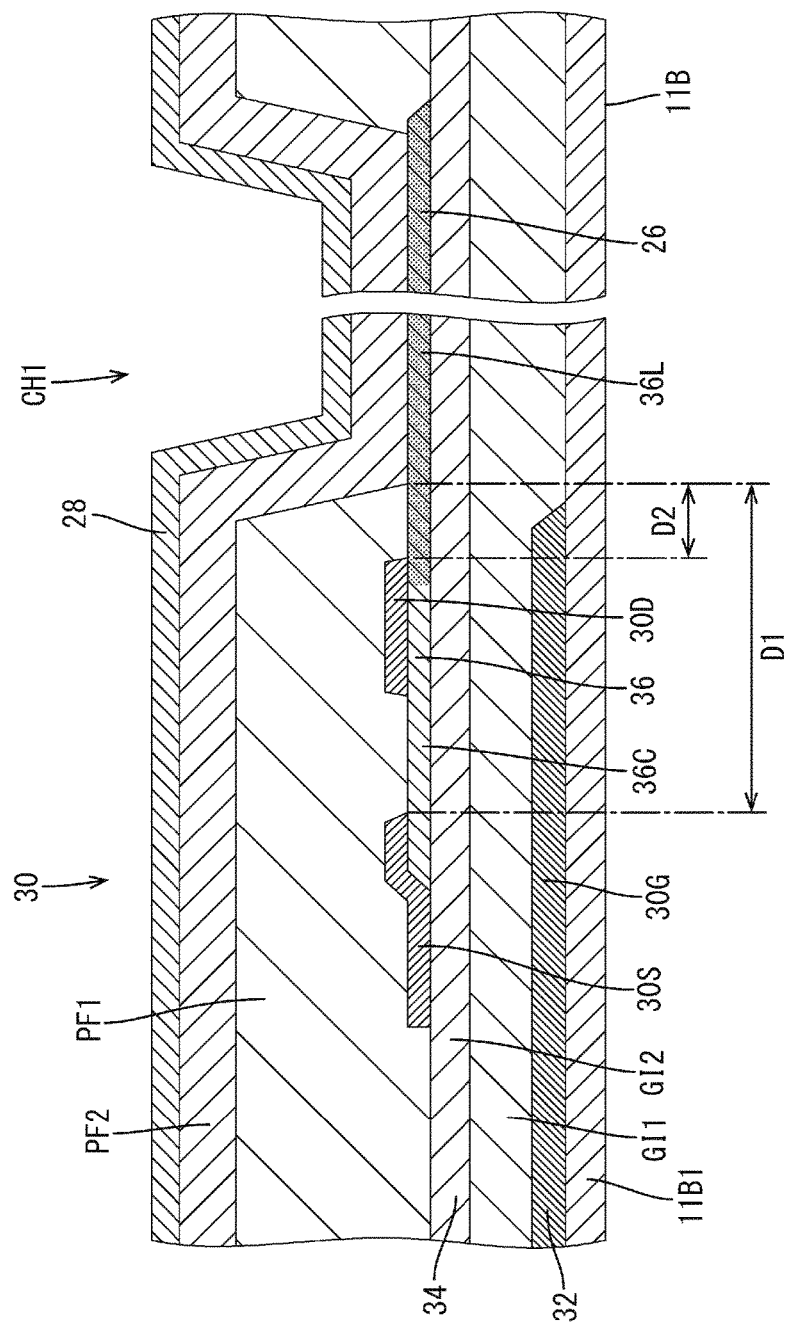
FIG. 5 is a cross-sectional view of a TFT shown in the V-V cross section in FIG. 4.

As shown in FIGS. 4 and 5, the TFT 30 is layered from gate wiring line 32 to the source wiring line 34, and the entirety of the TFT overlaps the gate wiring line 32 in a plan view. The part of the gate wiring line 32 overlapping the TFT 30 in a plan view forms the gate electrode 30G of the TFT 30. The source wiring line 34 protrudes slightly along the gate wiring line 32 from the location intersecting with the gate wiring line 32, and this protruded location forms the source electrode (one example of a first conductive film) 30S of the TFT 30. The gate electrode 30G and source electrode 30S are made of a metal film constituted by a plurality of metals stacked together, in a similar manner to the gate wiring line 32 and source wiring line 34. Furthermore, the TFT 30 has an island-shaped drain electrode 30D facing the source electrode 30S with a prescribed gap in the X-axis direction therebetween. The drain electrode 30D is made of a metal film constituted by a plurality of metals layered together, and one end of the dray electrode slightly overhangs one end of the pixel electrode 26.

The various insulating films stacked on the array substrate 11B will be described with reference to FIG. 5. The various insulating films and protective films layered on the array substrate 11B are, from the bottom layer side (glass substrate 11B1 side), a first gate insulating film GI1, second gate insulating film GI2, first protective film (one example of first insulating film) PF1, and second protective film (one example of second insulating film) PF2. The first gate insulating film GI1 and second gate insulating film GI2 are layered at least above the gate wiring line 32 and gate electrode 30 and are made of a transparent inorganic material. The first protective film PF1 is disposed in a layer above at least the oxide semiconductor film 36 (described later) and made of a transparent inorganic material. A first contact hole (one example of a contact hole) CH1 is formed in a location of the first protective film PF1 overlapping the pixel electrode 26 in a plan view (see FIG. 4). Accordingly, in a similar manner to the pixel electrode 26, the first contact hole CH1 is provided in generally the entirety of the region surrounded by the gate wiring lines 32 and source wiring lines 34. The second protective film PF2 is layered at least above the first protective film while straddling the first contact hole CH1 in the first protective film PF1 and is made of a transparent inorganic material. The materials etc. constituting the first gate insulating film GI1, second gate insulating film GI2, first protective film PF1, and second protective film PF2 will be described in detail later.

The TFT 30 and the multilayer structure of various films formed in the vicinity of the TFT 30 will be described in detail. As shown in FIG. 5, the TFT 30 includes a gate electrode 30G, oxide semiconductor film 36, source electrode 30S, and drain electrode 30D. Among these, the oxide semiconductor film 36 includes a channel region 36C provided along the X-axis direction overlapping the gate wiring line 32 in a plan view, and a lowered-resistance region 36L provided outside of the channel region 36C and formed by lowering the resistance of the oxide semiconductor film 36. One portion of the source electrode 30S is layered on an end of the channel region 36C to connect to the channel region 36C, and the drain electrode 30D is layered on the other end of the channel region 36C to connect to the channel region 36C. The source electrode 30S and drain electrode 30D face each other with a prescribed gap therebetween in the extension direction (X-axis direction) of the channel region 36C. With this configuration, the channel section 36C makes it possible for electrons to move between the electrodes by bridging the gap between the source electrode 30S and drain electrode 30D. The channel region 36C of the oxide semiconductor film 36, source electrode 30S, and drain electrode 30D are all covered by the first protective film PF1. Meanwhile, as shown in FIGS. 4 and 5, the lowered-resistance region 36L of the oxide semiconductor film 36 extends to outside of the TFT 30 and forms the respective pixel electrodes 26.

The specific oxide semiconductor forming the semiconductor film 36 is a transparent In—Ga—Zn—O semiconductor (indium gallium zinc oxide) containing indium (In), gallium (Ga), zinc (Zn), and oxygen (O), for example. The In—Ga—Zn—O semiconductor is a ternary oxide including In (indium), Ga (gallium), and Zn (zinc), and there are no particular limitations to the proportion (composition ratio) of In, Ga, and Zn, which includes In:Ga:Zn=2:2:1, In:Ga: Zn=1:1:1, and In:Ga:Zn=1:1:2 and the like, for example. The oxide semiconductor (In—Ga—Zn—O semiconductor) forming the oxide semiconductor film 36 may be amorphous, but is preferably crystalline. The crystalline oxide semiconductor is preferably a crystalline In—Ga—Zn—O semiconductor with a c-axis oriented mostly perpendicularly to the plane. The crystalline structure of such an oxide semiconductor (In—Ga—Zn—O semiconductor) is described in Japanese Patent Application Laid-Open Publication No. 2012-134475, for example. All the content disclosed in Japanese Patent Application Laid-Open Publication No. 2012-134475 is incorporated by reference in the present specification.

Furthermore, the oxide semiconductor film 36 has an electron mobility that is approximately 20 to 50 times higher than an amorphous silicon thin film or the like, for example; thus, it is possible to easily shrink the size of the TFT 30 and maximize the transmitted light amount of the pixel electrode 26. Therefore, this is suitable for making the liquid crystal panel 11 high-definition and for reducing the power consumption of the backlight device 14. Moreover, making the material of the channel region 36C an oxide semiconductor increases the OFF characteristics of the TFT 30 and vastly lowers the OFF-leakage current to approximately $\frac{1}{100}$th of an amorphous silicon channel region, for example; therefore, this is suitable for increasing the voltage retention rate of the pixel electrode 26 and reducing the power consumption of the liquid crystal panel 11. The TFT 30 having this type of channel region 36C is an inverted staggered TFT constituted by having the gate electrode 30G in the bottommost layer and the channel region 36C stacked in a layer above the gate electrode with the respective gate insulating films GI1 and GI2 interposed therebetween; the TFT 30 has a multilayer structure that is similar to an ordinary amorphous silicon thin film.

As shown in FIG. 5, the first protective film PF1 is formed on the oxide semiconductor film 36, and the reducing second protective film PF2 is formed on the first protective film PF1. The first contact hole CH1 is formed in a portion of the first protective film PF1 as described above, and this exposes a portion of the oxide semiconductor film 36 inside the first contact hole CH1. The second protective film PF2 is formed to straddle the first contact hole CH1, and thus a portion of the second protective film PF2 contacts a portion of the oxide semiconductor film 36 exposed inside the first contact hole CH1. In the array substrate 11B of the present embodiment, lowering the electrical resistance of the region of the oxide semiconductor film 36 contacting the second protective film PF2 and the area around this area forms the lowered-resistance region 36L, and this lowered-resistance region 36L is a conductive region that forms the pixel electrodes 26 of the liquid crystal panel 11. The pixel electrode 26 is electrically connected to the drain electrode 30D by one end of the pixel electrode overlapping the drain electrode 30D (see FIG. 5). Due to the pixel electrode 26 connecting to the drain electrode 30D, when the gate electrode 30G of the TFT 30 becomes conductive (when the TFT 30 is turned ON), current flows between the source electrode 30S and drain electrode 30D via the channel region 36C and a prescribed voltage is applied to the pixel electrode 26.

The common electrode 28 is formed across the respective pixels on the second protective film PF2. A reference potential is applied to the common electrode 28 from a common electrode wiring line, and the TFT 30 controlling the potential applied to the pixel electrode 26 makes it possible to generate a prescribed difference in potential between the pixel electrode 26 and the common electrode 28. When a difference in potential is generated between both electrodes 26 and 28, a fringe field (lateral electric field) containing both a component along the surface of the array substrate 11B via the slit openings 26A in the common electrode 26 and a component in the direction intersecting the surface of the array substrate 11B is applied to the liquid crystal layer 11C. Thus, in regard to the liquid crystal molecules contained in the liquid crystal layer 11C, it is possible to appropriately switch the orientation states of both the molecules above the slit openings 26A and the molecules above the common electrode 28. Therefore, it is possible to increase the aperture ratio of the liquid crystal panel 11, achieve a sufficient transmitted light amount, and have a high viewing angle performance.

Next, the configuration of the color filter substrate 11A in the display area A1 of the liquid crystal panel 11 will be described. As shown in FIG. 3, a large number of color filters 11H arranged next to one another in a matrix pattern are provided on the inner surface side (liquid crystal layer 11C) side of the glass substrate 11A1 constituting the color filter substrate 11A so as to overlap the respective pixel electrodes 26 on the array substrate 11B side in a plan view. These color filters 11H are constituted by respective colored portions such as R (red), G (green), and B (blue). A substantially grid-shaped light-shielding film (black matrix) 11I for preventing colors from mixing is formed between the respective colored portions constituting the color filter 11H. This light-shielding film 11I overlaps the gate wiring lines 32 and the source wiring lines 34 described above in a plan view. A transparent insulating film (not shown) is formed as a protective film on the inner surface side (liquid crystal layer 11C side) of the color filters 11H and light-shielding film 11I. In the liquid crystal panel 11, one display pixel, which is a display unit of the liquid crystal panel 11, is formed of a group of three colored portions R (red), G (green), and B (blue), and three pixel electrodes 26 opposing these portions. A display pixel is made of a red pixel having an R colored portion, a green pixel having a G colored portion, and a blue pixel having a B colored portion. These respective pixels are repeatedly arranged next to one another along the row direction (X-axis direction) on the surface of the liquid crystal panel 11 to form a pixel group, and a large number of these pixel groups are arranged next to each other along the column direction (Y-axis direction).

The above is a configuration of the liquid crystal panel 11 of the present embodiment, and next one example of a method of manufacturing the liquid crystal panel 11 having a configuration similar to above will be described. The liquid crystal panel 11 of the present embodiment can be manufactured by patterning with an already-known photolithography method. Of the members constituting the liquid crystal panel 11, the method of manufacturing the array substrate 11B in particular will be described in detail below. A method of manufacturing the color filter substrate 11A will be described first. First, the light-shielding film 11I is formed on the glass substrate 11A1 and processed into a generally grid-like pattern via photolithography. The light-shielding film 11I is formed by titanium (Ti), for example, and has a thickness of e.g. 200 nm. Next, the respective colored portions constituting the color filters 11H are formed in the desired locations. Next, a transparent insulating film is formed as the protective film so as to cover the light-shielding film 11I and color filter 11H. This insulating film is made of silicon dioxide (SiO2), for example, and has a thickness of e.g. 200 nm. Thereafter, the alignment film 11D is formed on the surface of the insulating film. The above process completes the color filter substrate 11A.

Figure 6:
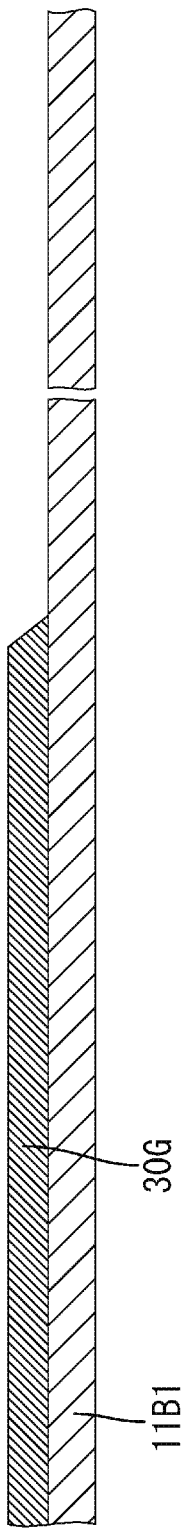
FIG. 6 is a cross-sectional view showing a manufacturing step (1) of the TFT.
Figure 7:
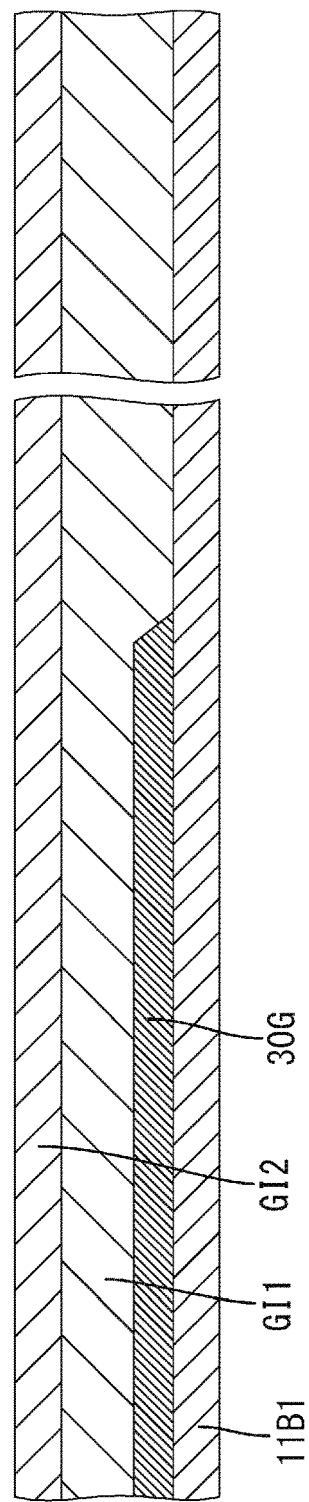
FIG. 7 is a cross-sectional view showing a manufacturing step (2) of the TFT.
Figure 8:
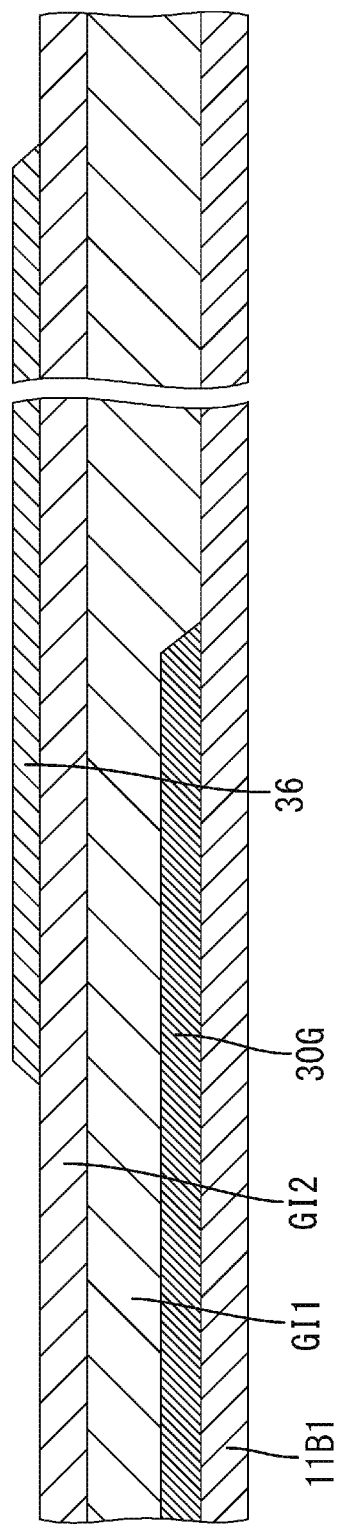
FIG. 8 is a cross-sectional view showing a manufacturing step (3) of the TFT.

Next, a method of manufacturing the array substrate 11B will be explained. First, as shown in FIG. 6, a metal film constituting the gate wiring line 32 and gate electrode 30G is formed on the glass substrate 11B1 and a first photomask is used to process the film into the desired pattern via photolithography. This metal film is 100 nm and a multilayer structure of tungsten (W) and tantalum nitride (TaN), for example. Next, as shown in FIG. 7, CVD (chemical vapor deposition) is used to form the first gate insulating film GI1 and second gate insulating film GI2. The first gate insulating film GI1 is made of silicon dioxide (SiO2) at a thickness of 50 nm, for example, and the second gate insulating GI2 is made of silicon nitride (SiNX) at a thickness of 300 nm, for example. Next, as shown in FIG. 8, sputtering is used to deposit the oxide semiconductor film 36 on the second gate insulating film GI2, and a second photomask is used to form this film into the desired pattern via photolithography. This oxide semiconductor film 36, as described above, is made of indium gallium zinc oxide (an In—Ga—Zn—O semiconductor), for example, and has a thickness of e.g. 50 nm.

In the array substrate 11B of the present embodiment, a second contact hole (not shown) is formed in a location of the first gate insulating film GI1 and second gate insulating film GI2 overlapping a portion of the source wiring line 34 in a plan view, and a source/gate connector (not shown) that electrically connects a portion of the gate wiring line 32 to a portion of the source wiring line 34 is disposed inside this second contact hole. By using this source/gate connector as a lead-out wiring line that electrically connects the source wiring lines 34 and gate wiring lines 32, it is possible to have a driver circuit integrally formed on the array substrate 11B, for example, which allows for the manufacture of a high-quality liquid crystal panel 11. In the manufacturing process of the array substrate 11B of the present embodiment, the second contact hole that forms a portion of the source/gate connector is formed via photolithograph and dry etching using a third photomask after the oxide semiconductor film 36 has been deposited.

Figure 9:
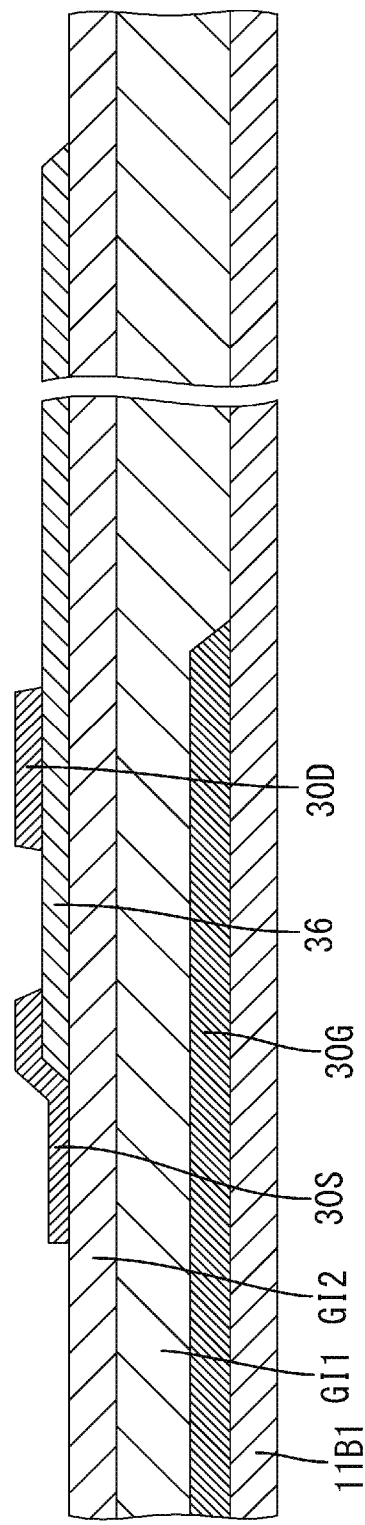
FIG. 9 is a cross-sectional view showing a manufacturing step (4) of the TFT.

Next, as shown in FIG. 9, the metal film constituting the source wiring line 34, source electrode 30S, and drain electrode 30D is processed into the desired shape via photolithography by using a fourth photomask. This metal film is a three-layer multilayer structure of titanium (Ti) at a thickness of 100 nm, aluminum (Al) at a thickness of 200 nm, and titanium (Ti) at a thickness of 50 nm, for example. Accordingly, the source electrode 30S and drain electrode 30D have lower electrical resistance than the oxide semiconductor film 36, which is made of indium gallium zinc oxide.

Figure 10:
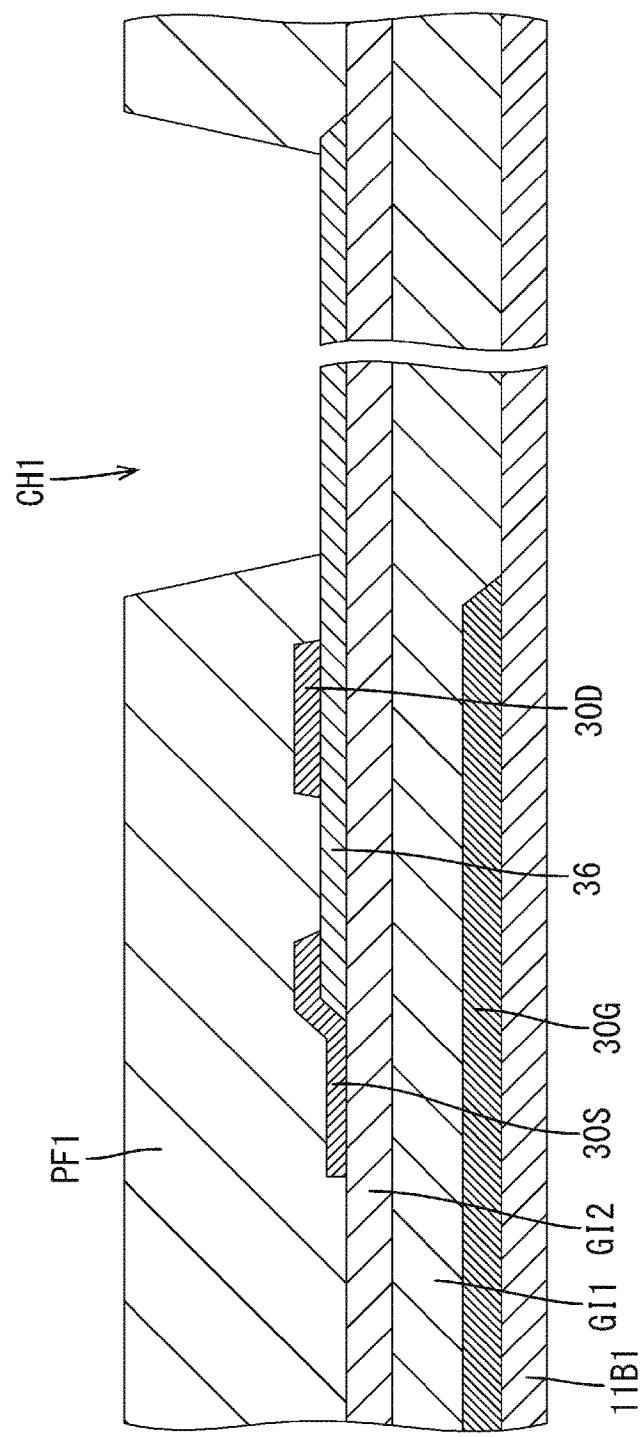
FIG. 10 is a cross-sectional view showing a manufacturing step (5) of the TFT.
Figure 11:
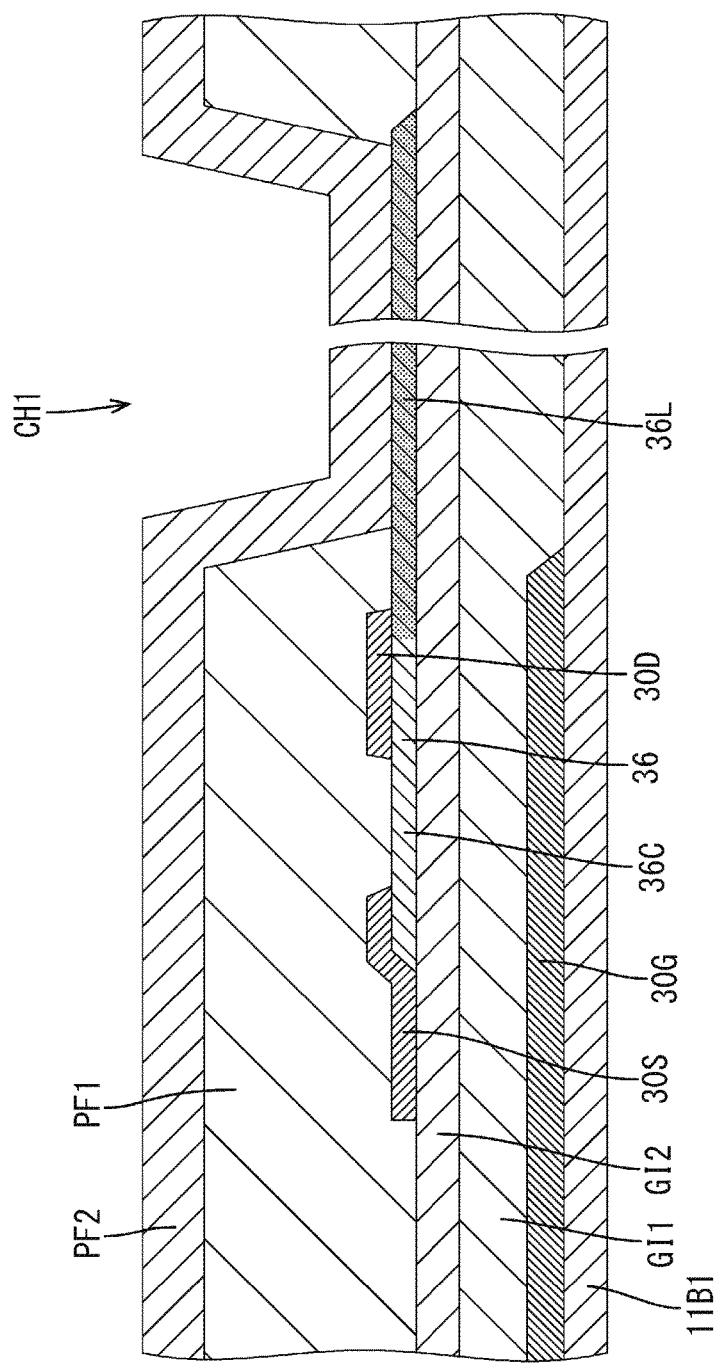
FIG. 11 is a cross-sectional view showing a manufacturing step (6) of the TFT.
Figure 12:
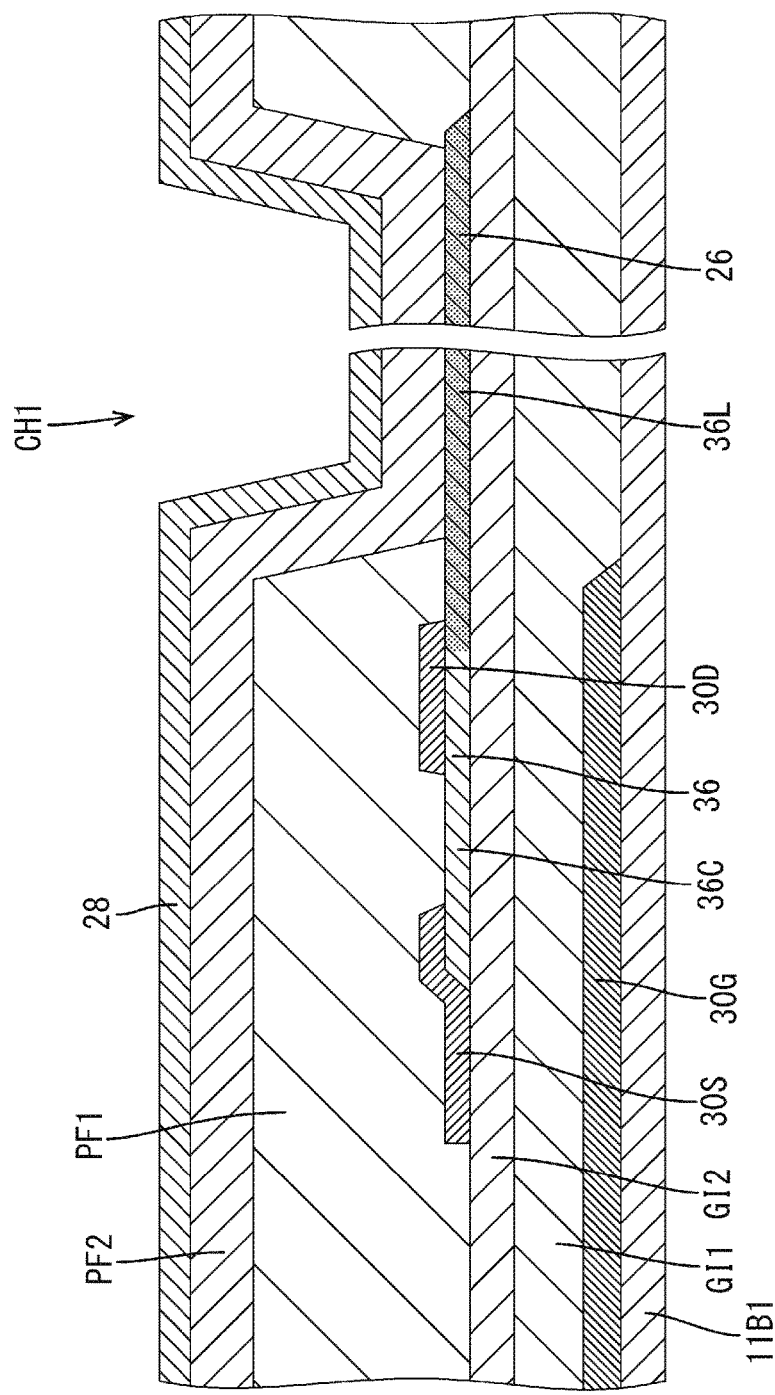
FIG. 12 is a cross-sectional view showing a manufacturing step (7) of the TFT.

Next, the first protective film PF1 is deposited via CVD so as to cover the gate insulating film 321, oxide semiconductor film 36, source wiring line 34, source electrode 30S, and drain electrode 30D. This first protective film PF1 is made of silicon dioxide (SiO2) at a thickness of 300 nm, for example. Next, as shown in FIG. 10, the first protective film IF1 at locations corresponding to the first contact hole CH1 is removed via photolithography using a fifth photomask, and the first contact hole CH1 is formed such that a portion of the oxide semiconductor film 36 is exposed. Next, as shown in FIG. 11, the second protective film PF2 is deposited so as to cover the first protective film PF1 and straddle the first contact hole CH1. This second protective film PF2 is made of silicon nitride (SiNX) and has a thickness of 100 nm, for example.

Depositing the second protective film PF2 in the manner described above causes a portion of the oxide semiconductor film 36 exposed inside the first contact hole CH1 to contact the second protective film PF2, and the contacting region of the oxide semiconductor film and region around the contacted region have the resistances thereof lowered to form the lowered-resistance region 36L. In other words, the silicon nitride (SiNX) constituting the second protective film PF2 contain a Si—H bond, and when the second protective film PF2 contacts the portion of the oxide semiconductor film 36, the hydrogen in this Si—H bond detaches and then enters and is diffused in the region of the oxide semiconductor film 36 making contact with the second protective film. This reduces the region of the oxide semiconductor film 36 contacting the second protective film due to the strong reducing effects of hydrogen, thus lowering the resistance of this region. Furthermore, the hydrogen diffuses across a vicinity of the region of the oxide semiconductor film 36 contacting the second protective film, which also reduces and lowers the resistance of this vicinity region. This forms the lowered-resistance region 36L in a portion of the oxide semiconductor film 36. The sheet resistance of the lowered-resistance region 36L formed in this manner is 100 100 kΩ/□ or below. The area of the oxide semiconductor film 36 except for the lowered-resistance region 36L, or namely the area located between the source electrode 30S and drain electrode 30D and the area in the vicinity thereof serves as the channel region 36C.

In the manufacturing process of the array substrate 11B of the present embodiment, after the second protective film PF2 has been deposited, an annealing treatment may be formed at a temperature greater than or equal to the forming temperature for forming the second protective film PF2 (e.g., 300° C.). This makes it possible to further diffuse the hydrogen contained in the second protective film PF2 into the region of the oxide semiconductor film 36 contacting the second protective film. As a result, it is possible to further lower the electrical resistance of the lowered-resistance region 36L. Furthermore, in the array substrate 11B of the present embodiment, a third contact hole (not shown) is formed in a location of the first gate protective film PF1 and second protective film PF2 overlapping a portion of the source wiring line 34 in a plan view, and a source/electrode connector (not shown) that electrically connects a portion of the common electrode 28 to a portion of the source wiring line 34 is disposed inside this third contact hole. In the manufacturing process of the array substrate 11B of the present embodiment, the third contact hole that forms a portion of the source/electrode connector is formed via photolithograph and dry etching using a sixth photomask after the second protective film PF2 has been deposited.

After the third contact hole is formed, the common electrode 28 is formed on the second insulating film PF2 so as to straddle the plurality of pixel electrode 26 and then processed into the desired shape via photolithography using a seventh photomask. The common electrode 28 is made of a transparent electrode material such as indium zinc oxide (IZO) at a thickness of 100 nm, for example. Thereafter, the alignment film 11E is formed on the surface of the common electrode 28. This alignment film 11E is a photoalignment film made of a polyimide, for example, and illuminating the alignment film with light of a specific wavelength range (ultraviolet, etc.) during the manufacturing process of the array substrate 11B makes it possible to align the liquid crystal molecules along the illumination direction of the light. If a rubbing treatment were to be performed on the alignment film, there is a risk that level differences in the first contact hole CH1 and the like would cause disruptions in the alignment and lower the contrast of the images displayed in the display area A1. Therefore, in the present embodiment, it is preferable that the alignment film 11E be a photoalignment film. Having the alignment film 11E be a photoalignment film makes it unnecessary to perform a rubbing treatment; therefore, it is possible to inhibit or prevent a reduction in contrast caused by such disruptions in alignment. The above process completes the array substrate 11B.

Next, photospacers are arranged on the alignment film 11E of the array substrate 11B, and both substrates 11A and 11B are bonded together with the alignment film 11E of the array substrate 11B and the alignment film 11D of the color filter substrate 11A each facing inward, thus forming the bonded substrate. Next, the gap between the array substrate 11B and color filter substrate 11A formed by the photospacers is injected with liquid crystal to form the liquid crystal layer 11C between both substrates 11A and 11B. Next, the bonded substrate is cut to the desired size. Thereafter, the polarizing plates 11F and 11G are respectively attached to the outer surface sides of the color filter substrate 11A and the array substrate 11B, thereby completing the liquid crystal panel 11 of the present invention.

However, in the liquid crystal panel 11 manufactured under the parameters of the manufacturing method described above, it was discovered by the inventors of the present invention that the diffusion distance of the hydrogen inside the oxide semiconductor film 36 is 1.5 µm regardless of the width (dimension of the direction orthogonal to the extension direction of the oxide semiconductor film 36) of the oxide semiconductor film 36 formed on the array substrate 11B. In other words it was discovered that, regardless of the width of the oxide semiconductor film 36, the diffusion distance of the hydrogen introduced into the region of the oxide semiconductor film 36 contacting the second protective film PF2 is 1.5 µm from the end of this region, or in other words from the edge of the first contact hole CH, to the outside of the contacting region (the outside of the first contact hole CH1).

Thus, in the present embodiment the distance D1 between the edge of the first contact hole CH1 and the source electrode 30S (see FIG. 5) is set to be greater than 1.5 µm. Therefore, in the manufacturing process of the array substrate 11B, it is possible to inhibit or prevent the hydrogen that has been introduced from the second protective film PF2 into a portion of the oxide semiconductor film 36 exposed within the first contact hole CH1 from diffusing to the source electrode 30S. This makes it possible to inhibit or prevent the source electrode 30S and drain electrode 30D from being conductive with each other, which allows further enhancement of operational reliability of the TFT 30. Meanwhile, in the present embodiment, the distance D2 (see FIG. 5) between the edge of the first contact hole CH1 and the drain electrode 30D is set to be smaller than 1.5 µm. Therefore, the hydrogen introduced into the oxide semiconductor film 36 is diffused up to the drain electrode 30D, and one end of the lowered-resistance region 36L overlapping one end of the drain electrode 30D electrically connects both together. This ensures the operational reliability of the TFT 30.

In the TFT 30 of the present embodiment as described above, in the manufacturing process of the TFT the second protective film PF2 having reducing characteristics (i.e., containing hydrogen) contacts a portion of the oxide semiconductor film 36 exposed inside the first contact hole CH1, and this reduces (introduces hydrogen to) the region of the oxide semiconductor film 36 contacting the second protective film, thereby lowering the resistance of this region and forming the lowered-resistance region 36L. Therefore, it is possible to form the lowered-resistance region 36L in a portion of the oxide semiconductor film 36 without performing a special treatment such as a hydrogen plasma treatment on the oxide semiconductor film 36, thereby allowing for manufacturing costs to be cut.

Moreover, in the TFT 30 of the present embodiment, the first protective film PF1 is disposed below the second protective film PF2 so as to cover at least the channel region 36C; therefore, in the manufacturing process of the TFT, the channel region 36C is covered by the first protective film PF1 before the second protective film PF2 is formed. Thus, during the forming of the second protective film PF2 in the manufacturing process, it is harder for the channel region 36C to be affected by the second protective film PF2 (i.e., harder for hydrogen to be introduced into the channel region 36C) than if the first protective film PF1 were interposed between the channel region 36C and second protective film PF2 and the second protective film were formed directly on the oxide semiconductor film via a photomask etc., for example. As a result, it is possible to prevent or inhibit the channel region 36C from being reduced due to being affected by the second protective film PF2, which allows the TFT 30 to have excellent operational reliability.

Furthermore, the TFT 30 of the present embodiment includes a drain electrode 30D that is electrically connected to the lowered-resistance region 36L and that has a lower electrical resistance than the lowered-resistance region 36L, and when the TFT 30 is turned ON, the source electrode 30S and drain electrode 30D electrically connect with each other via the channel region 36C. With this configuration, when the TFT 30 is turned ON, it is easier for electrons to move between the source electrode 30S and lowered-resistance region 36L, which makes it possible for the TFT 30 to have excellent electron mobility.

Modification Example of Embodiment 1

Figure 13:
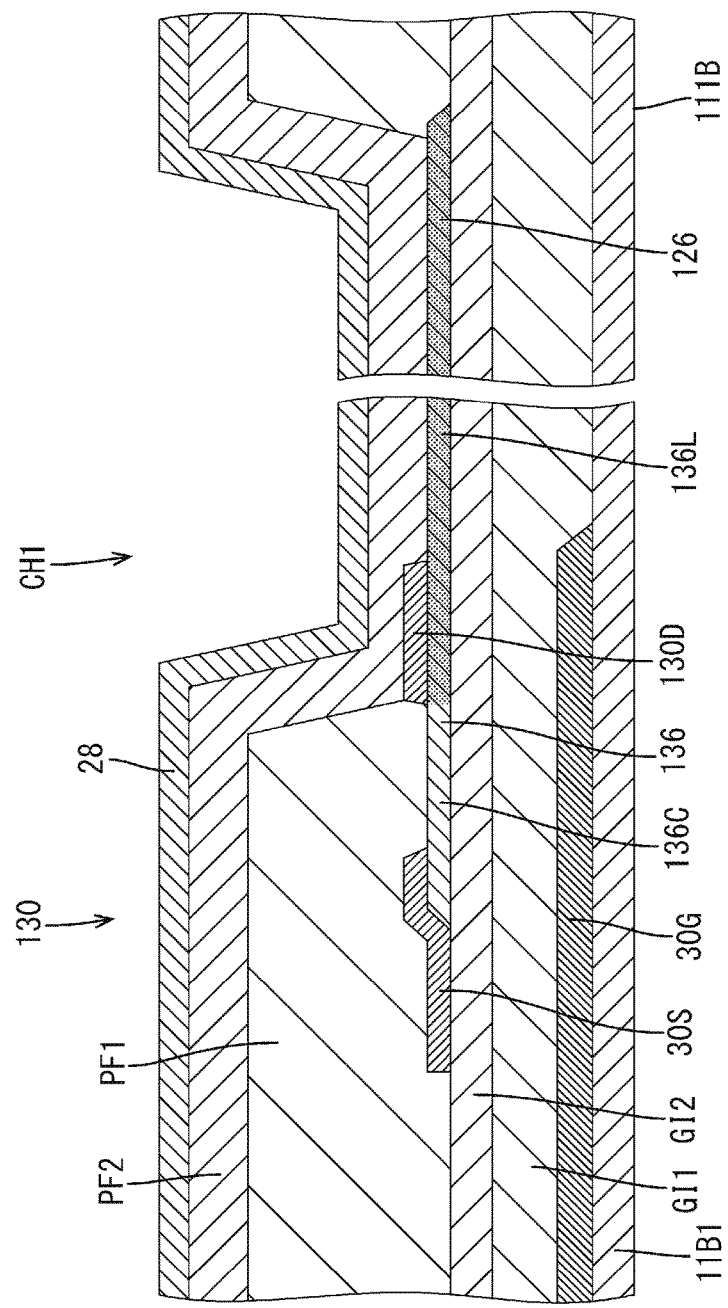
FIG. 13 is a cross-sectional view corresponding to a cross section shown in FIG. 5 of the TFT according to a modification example of Embodiment 1.

A modification example of Embodiment 1 will be described with reference to FIG. 13. In the present modification example, the placement of a drain electrode 130D differs from Embodiment 1. As shown in FIG. 13, in the array substrate 111B of the present modification example, the drain electrode 130D of a TFT 130 is disposed so as to be exposed within the first contact hole CH1. Furthermore, in the cross section shown in FIG. 13, the location of one end face of the drain electrode 130D generally coincides with the edge of the first contact hole CH1. Even with this configuration, the channel region 136C is covered by the first protective film PF1; therefore, when forming the second protective film PF2 in the manufacturing process, it is possible to prevent or inhibit the channel region 136C from being reduced due to being affected by the second protective film PF2.

Embodiment 2

Figure 14:
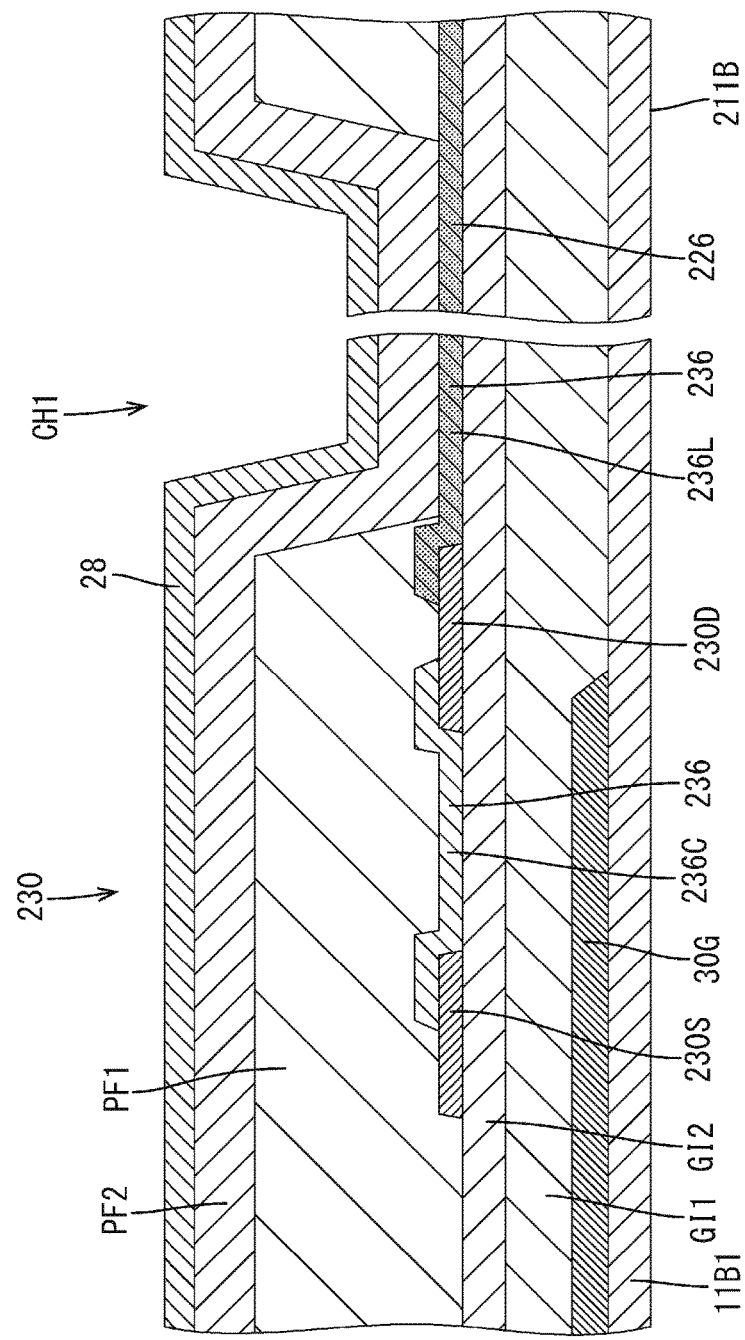
FIG. 14 is a cross-sectional view corresponding to a cross section shown in FIG. 5 of the TFT according to a modification example of Embodiment 2.
Figure 15:
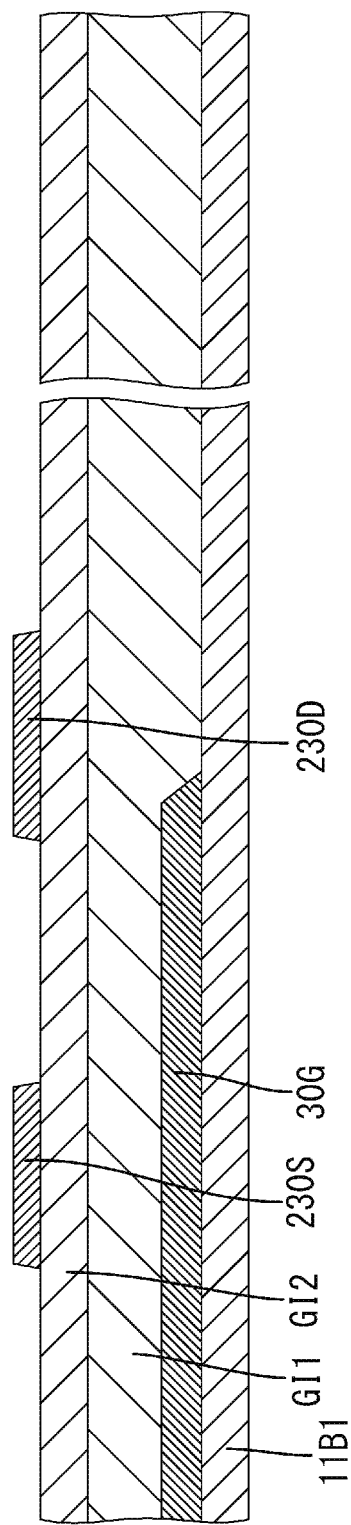
FIG. 15 is a cross-sectional view showing a manufacturing step (1) of the TFT according to Embodiment 2.
Figure 16:
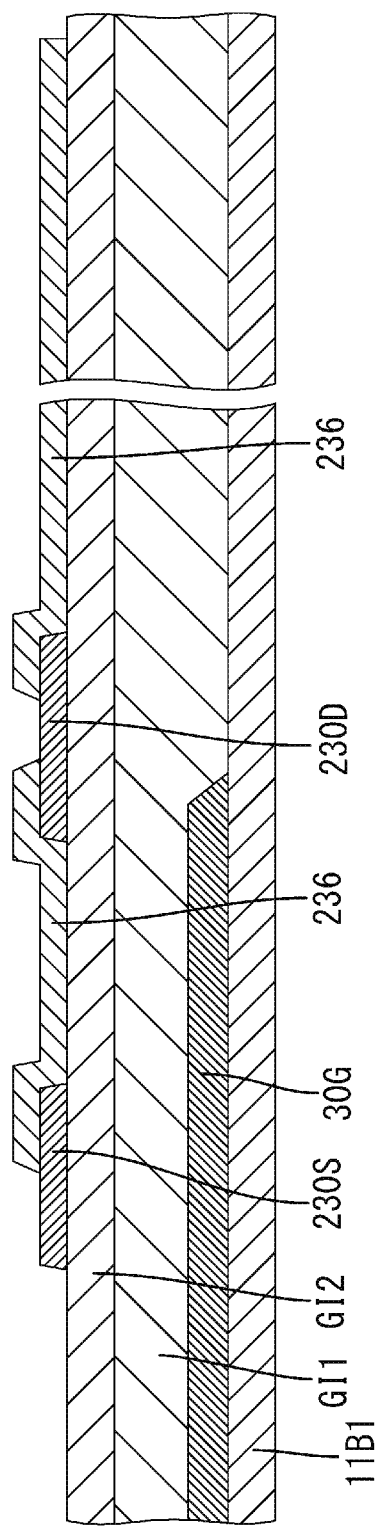
FIG. 16 is a cross-sectional view showing a manufacturing step (2) of the TFT according to Embodiment 2.

Embodiment 2 will be described with reference to FIGS. 14 to 16. Embodiment 2 differs from Embodiment 1 in the aspect of forming a source wiring line, source electrode 230S, drain electrode 230D, and oxide semiconductor film 236 on the array substrate 211B. Other configurations are the same as those of Embodiment 1, and thus repetitive descriptions of the structures, the operation, and the effect are omitted. As shown in FIG. 14, in the array substrate 211B of the present embodiment, the location of the channel region 236C of the oxide semiconductor film 236 connecting with the source electrode 230S is disposed above the source electrode 230S, and the location connecting with the drain electrode 230D is disposed above the drain electrode 230D. The location of the lowered-resistance region 236L of the oxide semiconductor film 236 connecting with the drain electrode 230D is disposed above the drain electrode 230D. Moreover, the channel region 236C and lowered-resistance region 236L are separated from each other by the drain electrode 230D.

Next, a method of manufacturing the array substrate 11B of the present embodiment will be described. The present manufacturing method differs from the manufacturing method of Embodiment 1 only in the method of forming the oxide semiconductor film and method of forming the source wiring line 234, source electrode 230S, and drain electrode 230D. The other forming methods, manufacturing methods, configuration of the oxide semiconductor film 236, and configuration of the metal film constituting the source wiring line 234, source electrode 230S, and drain electrode 230D are the same as in Embodiment 1, and thus repetitive explanations will be omitted. In the present manufacturing method, as shown in FIG. 15, after the second contact hole constituting the source/gate connector is formed, the metal film constituting the source wiring line 234, source electrode 230S, and drain electrode 230D is deposited and processed into the desired pattern via photolithography using a photomask. The configuration of this metal film is the same as described in Embodiment 1. Next, as shown in FIG. 16, sputtering is used to deposit the oxide semiconductor film 236, which is processed into the desired pattern via photolithography using a photomask such that the oxide semiconductor film 236 is separated into two above the drain electrode 230D.

Thereafter, the protective film PF1, protective film PF2, third contact hole, and common electrode 28 are each formed as described in Embodiment 1, thereby completing the array substrate 211B. In this manner, in the manufacturing process of the array substrate 211B of Embodiment 2, manufacturing can be performed by reversing the order in which the oxide semiconductor film 236 is formed and in which the source wiring line 234, source electrode 230S, and drain electrode 230D are formed as compared to the order in Embodiment 1. In the manufacturing method described above, by depositing the second protective film PF2, of the two separated portions of the oxide semiconductor film 236, the portion exposed inside the first contact hole CH1 has the resistance thereof reduced and becomes the lowered-resistance region 236L, and the other portion becomes the channel region 236C.

In the manufacturing process of the TFT, when the source electrode and drain electrode are formed after the oxide semiconductor film, damage may occur to the oxide semiconductor film during forming of the source electrode and drain electrode, and defects may occur in the oxide semiconductor film. As a countermeasure, in the manufacturing process of the array substrate 211B of the present embodiment, the oxide semiconductor film 236 is formed after the source electrode 230S and drain electrode 230D have been formed, which makes it possible to prevent or inhibit defects from occurring in the oxide semiconductor film 236.

Embodiment 3

Figure 17:
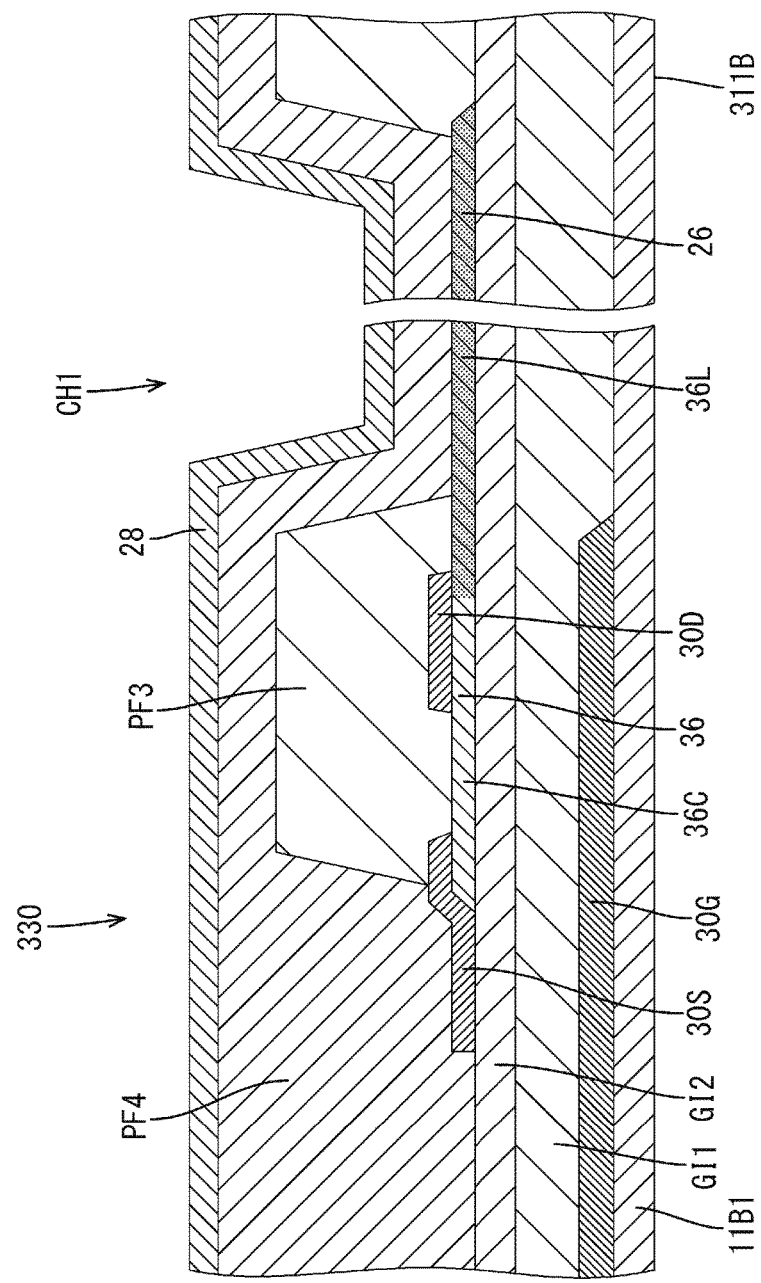
FIG. 17 is a cross-sectional view corresponding to a cross section shown in FIG. 5 of the TFT according to Embodiment 3.

Embodiment 3 will be described with reference to FIG. 17. Embodiment 3 differs from Embodiment 1 in the aspect of forming the first protective film PF3 and second protective film PF4. Other configurations are the same as those of Embodiment 1, and thus repetitive descriptions of the structures, the operation, and the effect are omitted. As shown in FIG. 17, in the array substrate 211B of the present embodiment, the first protective film PF3 covers only the area of the source electrode 30S of the TFT 330 connected to the channel region 36C and the area in the vicinity of this area; the second protective film PF4 covers the other areas. This second protective film PF4 is formed to surround in a plan view (not shown) the first protective film PF3 that covers the channel region 36C.

In the present embodiment, the first protective film PF3 and second protective film PF4 being formed in this manner makes the second protective film PF4 cover the side end of the first protective film PF3 covering the channel region 36C. Therefore, it is possible to prevent or inhibit light from entering inside the first protective film PF3 from the side end of the first protective film PF3. As a result, it is possible to prevent or inhibit the susceptibility of degradation of the channel region 36C that would be caused by light that has entered the first protective film PF3 reverberating between the first protective film and second protective film PF4 and then entering the channel region 36C.

Embodiment 4

Figure 18:
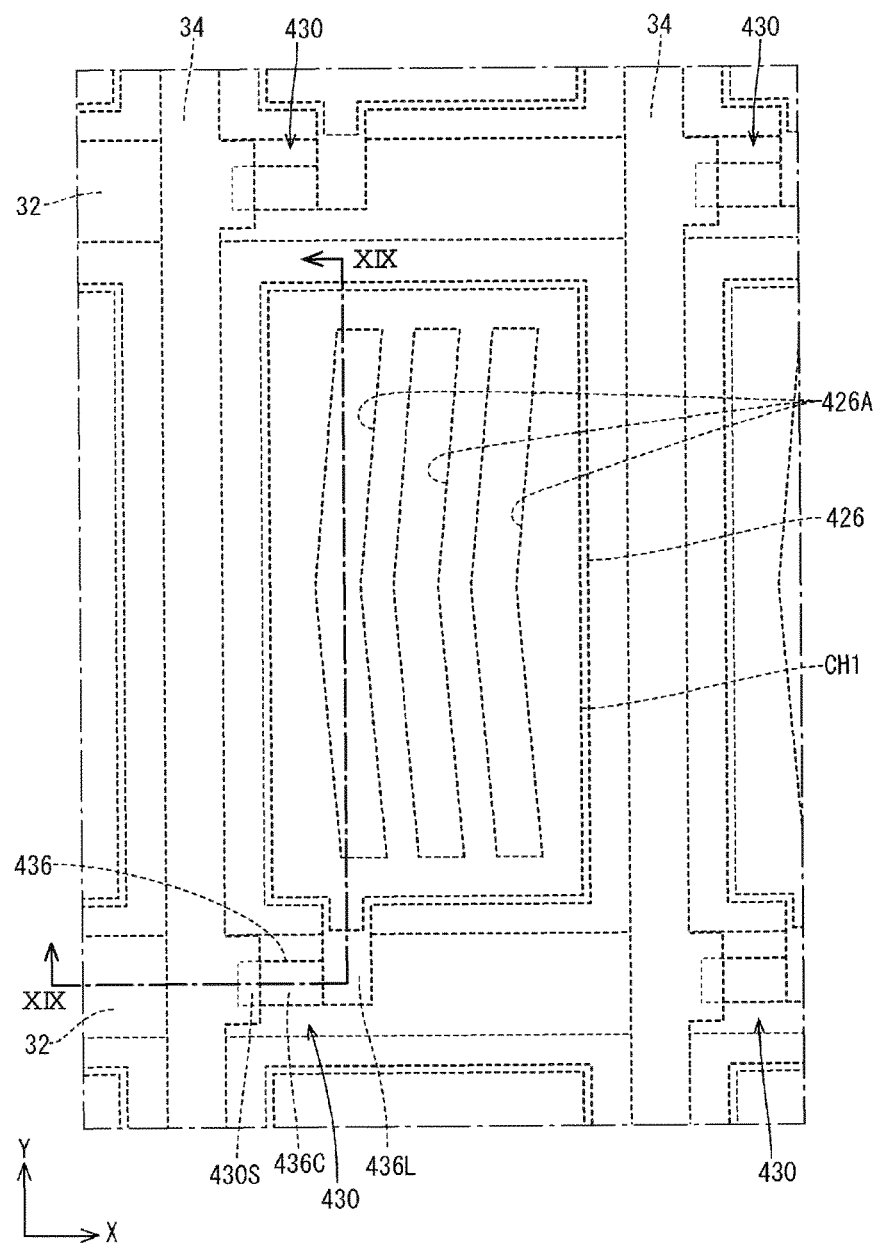
FIG. 18 is a plan view of a planar configuration of a pixel in a display area of an array substrate according to Embodiment 4.
Figure 19:
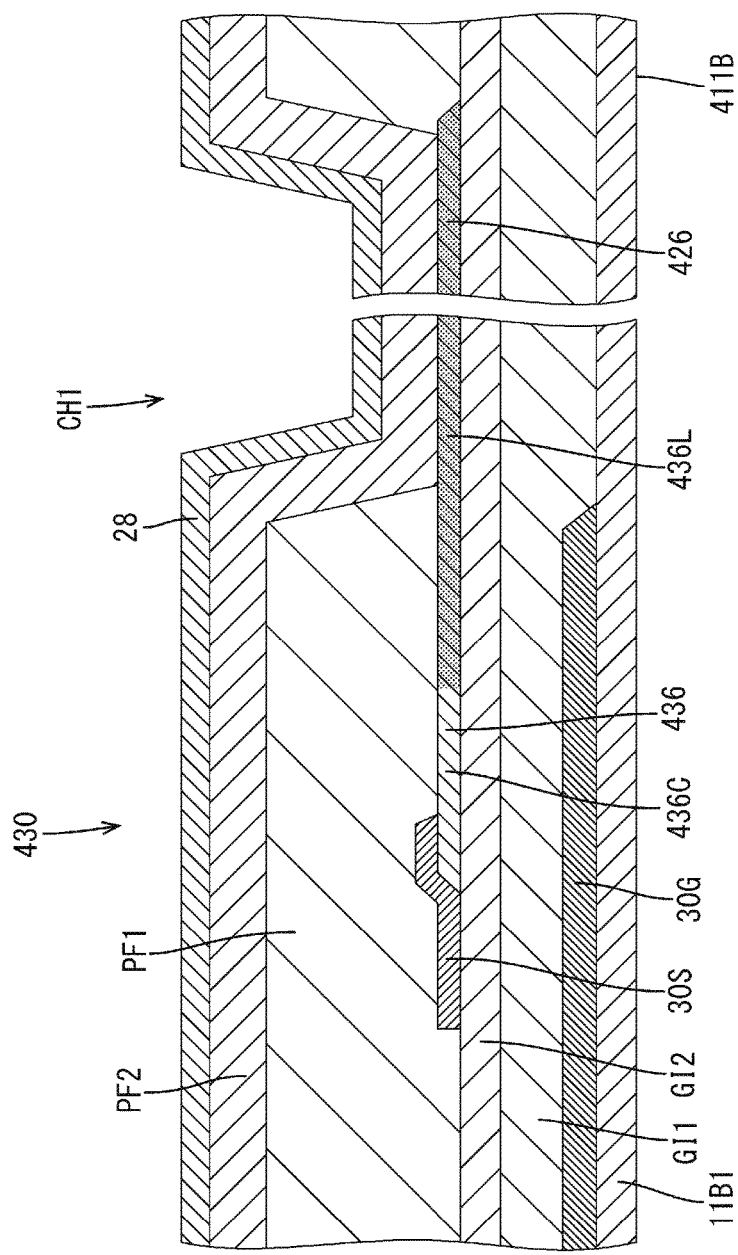
FIG. 19 is a cross-sectional view of a TFT according to Embodiment 4 shown by the XIX-XIX cross section in FIG. 18.

Embodiment 4 will be described with reference to FIGS. 18 and 19. Embodiment 4 differs from Embodiment 1 in that the TFT 430 does not include a drain electrode. Other configurations are the same as those of Embodiment 1, and thus repetitive descriptions of the structures, the operation, and the effect are omitted. As shown in FIGS. 18 and 19, in the array substrate 411B of the present embodiment, the drain electrode is not formed in the TFT 430, and the distance between the source electrode 430S and lowered-resistance region 436L is set to be less than in Embodiment 1.

In the present embodiment, the TFT 430 does not include a drain electrode, and thus when the TFT 430 turns ON, electrons move between the source electrode 430S and lowered-resistance region 436L via the channel region 436C. Furthermore, in the manufacturing process of the array substrate 411B, it is not necessary to form the metal film constituting the drain electrode between the channel region 436C and lowered-resistance region 436L, which makes it unnecessary to consider the yield of such a metal film, thereby allowing manufacturing costs to be cut even more.

Modification examples of the respective embodiments mentioned above are described below.

(1) In the respective embodiments described above, an example was shown in which the second protective film was made of silicon nitride containing hydrogen, but the second protective film is not limited to being made of silicon nitride as long as the second protective film has reducing characteristics.

(2) In the respective embodiments described above, an example was shown in which the oxide semiconductor film was made of indium gallium zinc oxide, but the oxide semiconductor film is not limited to indium gallium zinc oxide as long as the resistance of the film is lowered via reduction.

(3) In the respective embodiments described above, an example was described in which the lowered-resistance region forms a portion of the pixel electrode, but the lowered-resistance region may alternatively form a portion of the common electrode. In such a case, a transparent electrode film formed on the second protective film may constitute the pixel electrode.

(4) In addition to the respective embodiments described above, it is possible to appropriately modify the configurations and formation parameters of the various thin films formed on the array substrate.

The embodiments of the present invention were described above in detail, but these are only examples, and do not limit the scope as defined by the claims. The technical scope defined by the claims includes various modifications of the specific examples described above.

DESCRIPTION OF REFERENCE CHARACTERS 10 liquid crystal display device
11 liquid crystal panel
11A color filter substrate
11A1, 11B1 glass substrate
11B, 111B, 211B, 311B, 411B array substrate
11C liquid crystal layer
14 backlight device
26, 126, 226, 426 pixel electrode
26A, 426A slit opening
28 common electrode
30, 130, 230, 330, 430 TFT
30D, 130D, 230D drain electrode
30G gate electrode
30S, 230S source electrode
32 gate wiring line
34 source wiring line
36, 136, 236, 436 oxide semiconductor film
36C, 136C, 236C, 436C channel region
36L, 136L, 236L, 436L lowered-resistance region
CH1 first contact hole
GI1 first gate insulating film
GI2 second gate insulating film
PF1, PF3 first protective film
PF2, PF4 second protective film

What is claimed is:

1. A semiconductor device, comprising:
    a first substrate;
    a gate electrode on the first substrate;
    a gate insulating layer on the gate electrode;
    an oxide semiconductor film including a channel region disposed over the gate electrode through the gate insulating layer, and a lowered-resistance region contacting the channel region;
    a source electrode and a drain electrode on the channel region;
    a first insulating film covering at least the channel region and including a contact hole that exposes the lowered-resistance region; and
    a second insulating film having reducing characteristics and disposed above the first insulating film across the contact hole, said second insulating film contacting the lowered-resistance region inside the contact hole,
    wherein the second insulating film contains hydrogen and
    wherein a distance between an edge of the contact hole and the source electrode is greater than 1.5 μm.

2. The semiconductor device according to claim 1, wherein the second insulating film surrounds, in a plan view, the first insulating film that covers the channel region.

3. The semiconductor device according to claim 1, wherein the oxide semiconductor film contains indium (In), gallium (Ga), zinc (Zn), and oxygen (O).

4. The semiconductor device according to claim 3, wherein the oxide semiconductor film is a crystalline oxide semiconductor film.

5. A liquid crystal display device, comprising:
    the semiconductor device according to claim 1;
    a second substrate facing the first substrate of the semiconductor device; and
    a liquid crystal layer containing liquid crystal molecules and interposed between the first substrate and second substrate,
    wherein the semiconductor device includes a third conductive film disposed in a location above the second insulating film overlapping at least the lowered-resistance region in a plan view,
    wherein one of the lowered-resistance region and the third conductive film has a plurality of slit openings having slit-like shapes, said one of the lowered-resistance region and the third conductive film forming a pixel electrode in each pixel, and
    wherein another of the lowered-resistance region and the third conductive film forms a common electrode that generates an electric field between the common electrode and the pixel electrode to control orientation of the liquid crystal molecules.

6. The semiconductor device according to claim 1, wherein the drain electrode is formed on a region in the oxide semiconductor film to which the lowered-resistance region extends.

7. The semiconductor device according to claim 1, wherein a distance between an edge of the contact hole and the drain electrode is smaller than 1.5 μm.

* * * * *